(12) United States Patent
Miyoshi

(10) Patent No.: US 7,759,934 B2
(45) Date of Patent: Jul. 20, 2010

(54) MAGNETIC RESONANCE IMAGING APPARATUS AND MAGNETIC RESONANCE IMAGE GENERATING METHOD

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 49 days.

(21) Appl. No.: 12/141,698

(22) Filed: Jun. 18, 2008

(65) Prior Publication Data

US 2008/0315876 A1 Dec. 25, 2008

(30) Foreign Application Priority Data

Jun. 20, 2007 (JP) ............... 2007-162649

(51) Int. Cl.
*G01V 3/00* (2006.01)
(52) U.S. Cl. .................. 324/309; 324/307
(58) Field of Classification Search .......... 324/300–322
See application file for complete search history.

(56) References Cited

U.S. PATENT DOCUMENTS

| | | | |
|---|---|---|---|
| 5,168,225 A | 12/1992 | Yamazaki et al. | |
| 5,347,216 A | 9/1994 | Foo | |
| 5,677,628 A * | 10/1997 | Watanabe et al. | 324/309 |
| 5,894,221 A * | 4/1999 | Watanabe et al. | 324/307 |
| 6,005,390 A * | 12/1999 | Watanabe et al. | 324/307 |
| 6,137,289 A | 10/2000 | Goto | |
| 6,208,136 B1 * | 3/2001 | Smith et al. | 324/300 |
| 6,230,039 B1 | 5/2001 | Stuber et al. | |
| 6,483,307 B2 | 11/2002 | Ookawa | |
| 6,750,651 B2 | 6/2004 | Overall | |
| 6,965,233 B2 | 11/2005 | Le Roux | |
| 7,239,138 B2 | 7/2007 | Smink | |
| 7,323,871 B2 | 1/2008 | Foo | |

(Continued)

FOREIGN PATENT DOCUMENTS

JP 06-205754 7/1994

(Continued)

OTHER PUBLICATIONS

European Search Report for application No. 08158373, Feb. 12, 2009, 6 pgs.

(Continued)

*Primary Examiner*—Brij B Shrivastav
*Assistant Examiner*—Dixomara Vargas
(74) *Attorney, Agent, or Firm*—Armstrong Teasdale LLP

(57) ABSTRACT

A magnetic resonance imaging apparatus configured to scan a subject in order to collect magnetic resonance signals from the subject in a magnetostatic field space. The magnetic resonance imaging apparatus includes a scanning unit that executes an imaging pulse sequence after executing a preparation pulse sequence to transmit preparation pulses. The scanning unit, during the preparation pulse sequence, excites a spin of the subject by successively transmitting a first chemical saturation pulse, a T2 preparation pulse and a second chemical saturation pulse, which is a reversed pulse; transmits a first killer gradient pulse after transmitting the first chemical saturation pulse and before transmitting the T2 preparation pulse; transmits a second killer gradient pulse after transmitting the T2 preparation pulse and before transmitting the second chemical saturation pulse; and transmits a third killer gradient pulse after transmitting the second chemical saturation pulse and before executing the imaging pulse sequence.

20 Claims, 8 Drawing Sheets

U.S. PATENT DOCUMENTS

| | | | |
|---|---|---|---|
| 7,425,828 B2 * | 9/2008 | Garwood et al. | 324/310 |
| 2003/0189425 A1 | 10/2003 | Le Roux | |
| 2006/0253015 A1 | 11/2006 | Nezafat et al. | |
| 2007/0145974 A1 | 6/2007 | Asano | |
| 2007/0167733 A1 | 7/2007 | Miyoshi | |

FOREIGN PATENT DOCUMENTS

| | | |
|---|---|---|
| JP | 2004-254884 | 9/2004 |

OTHER PUBLICATIONS

Kingo Yashimitsu, "Unsuppressed Fat in the Right Anterior Diaphragmatic Region on Fat—suppressed on T2-weighted Fast Spin-Echo MR Images," Journal of Magnetic Resonance Imaging, Mar. 1995, pp. 145-149, vol. 5, No. 2.

* cited by examiner (a)

(b)

MAGNETIC RESONANCE IMAGING APPARATUS AND MAGNETIC RESONANCE IMAGE GENERATING METHOD

CROSS REFERENCE TO RELATED APPLICATIONS

This application claims the benefit of Japanese Patent Application No. 2007-162649 filed Jun. 20, 2007, which is hereby incorporated by reference in its entirety.

BACKGROUND OF THE INVENTION

The subject matter disclosed herein relates to a magnetic resonance imaging (MRI) apparatus and a magnetic resonance image generating method. More particularly, it relates to a magnetic resonance imaging apparatus and a magnetic resonance image generating method for scanning a subject, in a magnetostatic field space accommodating the subject by executing, after executing a preparation pulse sequence in which preparation pulses are transmitted, an imaging sequence in which magnetic resonance signals are collected from the subject.

A magnetic resonance imaging apparatus is an apparatus to image a subject by using the nuclear magnetic resonance, and is used particularly extensively for medical purposes.

In a magnetic resonance imaging apparatus, by accommodating a subject in an imaging space in which a magnetostatic field is formed, the spin of protons in that subject is aligned in the direction of that magnetostatic field to generate a magnetization vector. Then, a nuclear magnetic resonance phenomenon is caused to arise by forming a high frequency magnetic field by transmitting an RF (radio frequency) pulse of the resonance frequency. This results in flipping of the direction of the spin to vary the magnetization vector of its protons. After that, magnetic resonance (MR) signals that are generated when the spin returns its protons to return to their original state of magnetization vector in the direction of the magnetostatic field. In this way, an imaging pulse sequence to collect magnetic resonance signals that are to be used as raw data when the subject is imaged is carried out. With the magnetic resonance signals obtained in the execution of that imaging pulse sequence being used as raw data, a magnetic resonance image, such as a slice image, of that subject is generated.

With a view to enhancing the contrast in such magnetic resonance images, methods are proposed by which a preparation pulse sequence of transmitting preparation pulses before the execution of the imaging pulse sequence to collect magnetic resonance signals.

For instance, transmission of T2 preparation pulses in advance to generate a T2-emphasized image as a magnetic resonance image is known (see, for instance, Japanese Patent No. 3341914). These T2 preparation pulses, also called "T2 preps" or "DE (driven equilibrium) pulses", are transmitted to match, for instance, an MLEV-4 method. More specifically, RF pulses are transmitted in a sequence of 90° RF pulse, 180° RF pulse, 180° RF pulse, −180° RF pulse, −180° RF pulse and −90° RF pulse, for instance. By so transmitting these T2 preparation pulses as to make their transmission time intervals 1:2:2:2:1, T2 emphasis is accomplished by keeping a plurality of tissues differing in transversal relaxation time (T2) in a state in which the magnetization moment of tissues longer in T2 is greater than the magnetization moment of tissues shorter in T2.

It is also known, for instance, that chemical saturation pulses are transmitted in advance in a preparation pulse sequence is order to generate a fat-restrained image as a magnetic resonance image (see, for instance, Japanese Unexamined Patent Publication No. 2004-254884). These chemical saturation pulses, also known as "Chem Sats", "spectral saturation pulses" or "CHESS (CHEmical Shift Selective) pulses", saturates the spin of a specific tissue by transmitting in advance frequency-selective RF pulses. Here is utilized a phenomenon in which a chemical shift occurs between a plurality of tissues, such as water and fat, for instance, to give rise to a difference in resonance frequency.

There also is a practice to execute a preparation pulse sequence in advance using both T2 preparation pulses and chemical saturation pulses as preparation pulses. When the abdomen of the subject is to be imaged by SSFP (steady state free precession), for instance, T2 preparation pulses are used to restrain magnetic resonance signals from such tissues as muscles and the liver, and at the same time chemical saturation pulses are used to restrain magnetic resonance signals from fat, thereby to emphasize magnetic resonance signals from blood streams.

FIGS. 8(a), 8(b), and 8(c) show a preparation pulse sequence PS that uses both a T2 preparation pulse PR and a chemical saturation pulse CS for restraining fat as preparation pulses and an imaging pulse sequence IS that is executed after that.

FIG. 8(a) is a pulse sequence graph, wherein the horizontal axis represents time and the longitudinal axis, the pulse intensity. "RF" represents the time axis of transmitting RF pulses and "GKill", the time axis of transmitting killer gradient pulses.

FIGS. 8(b) and 8(c) are graphs showing the behaviors of the magnetization moment of fat when the pulse sequence shown in FIG. 8(a) is executed, wherein the horizontal axis represents time and the longitudinal axis, the magnetization moment. Here FIG. 8(b) shows an ideal state in which the magnetostatic field is uniform, while FIG. 8(c) shows an unideal state in which the magnetostatic field is not uniform.

First, when the preparation pulse sequence PS is to be executed, the T2 preparation pulse PR is transmitted as shown in FIG. 8(a).

Here, as shown in FIG. 8(b), the magnetization moment of fat attenuates.

Next, a killer gradient pulse Gkp is transmitted as shown in FIG. 8(a).

Here, though not shown in particular, the transverse magnetization of the spin generated by the transmission of the T2 preparation pulse PR disappears. Together with this, as shown in FIG. 8(b), the magnetization moment of fat is recovered along with the lapse of time.

Next, as shown in FIG. 8(a), the chemical saturation pulse CS is transmitted.

Here, a chemical saturation pulse CS whose flip angle is 120°, for instance, is transmitted. Then, when the magnetostatic field is in the ideal uniform state as shown in FIG. 8(b), the magnetization moment of fat is reversed.

Next, as shown in FIG. 8(a), a killer gradient pulse Gkc is transmitted.

Here, though not shown in particular, the transverse magnetization of the spin generated by the transmission of a chemical saturation pulse CS disappears. Together with this, as shown in FIG. 8(b), the magnetization moment of fat is recovered along with the lapse of time.

Next, as shown in FIG. 8(a), the imaging pulse sequence IS is executed.

Here, after waiting until the magnetization moment of fat is recovered as shown in FIG. 8(b) and its magnetization moment becomes 0, the execution of the imaging pulse sequence IS is started.

By the operations described, fat can be restrained by using the magnetic resonance signals collected by the execution of the imaging pulse sequence IS and a magnetic resonance image with T2 emphasis can be generated.

However, in order to start the execution of the imaging pulse sequence IS at the time the magnetization moment has become 0 as stated above, the flip angle of the chemical saturation pulse CS and the length of the preparation time of waiting after the transmission of the chemical saturation pulse CS until the execution of the imaging pulse sequence IS need to be adjusted. This is to prevent magnetic resonance signals from fat from being affected by the T2 preparation pulse PR.

Since adjustment is needed in the foregoing case, it is sometimes difficult to accomplish scanning efficiently, and it was not easy to enhance the efficiency of diagnosis.

In addition to that, when the magnetostatic field is in the unideal state in which the magnetostatic field is not uniform as shown in FIG. 8(c), unlike in the ideal state in which the magnetostatic field is uniform, the non-uniformity of the magnetostatic field may prevent the positivity or negativity of the magnetization moment of fat from being reversed when the chemical saturation pulse CS is transmitted. If the non-uniformity of the magnetostatic field causes a flip of no more than about 90°, for instance, instead of 120° to take place even though the chemical saturation pulse CS of 120° in flip angle is transmitted as stated above for instance, the magnetization moment of fat will take on a value different from that in the ideal state (for instance, 0) after the transmission of the chemical saturation pulse CS as shown in FIG. 8(c).

As a consequence, if the killer gradient pulse Gkc is transmitted after that, the preparation time is let pass and the magnetization moment of fit is recovered as shown in FIG. 8(c), the magnetization moment may have a prescribed value that is not 0.

Therefore, when the magnetostatic field is in the unideal state in which the magnetostatic field is not uniform, magnetic resonance signals from a tissue to be saturated, such as fat, may fail to be restrained effectively, sometimes resulting in the occurrence of an artifact in the magnetic resonance image. Thus, even if an ideal state is supposed and a flip angle and a preparation time which are theoretically optimal are set, the susceptibility of the chemical saturation pulse CS to the non-uniformity of the magnetostatic field may make it possible for fat to be appropriately saturated.

Further, where the flip angle is set to 180° to make the chemical saturation pulse less susceptible to the non-uniformity of the magnetostatic field, the preparation time has to be extended, which would invite a T1 recovery and make the effect of transmitting the T2 preparation pulse insufficient.

Further, where scanning is to be done in synchronism with the heart beat, for instance, it may be required to transmit the T2 preparation pulse when the T1 recovery of fat is incomplete, and in such a case it is sometimes difficult set the optimal flip angle and preparation time on the basis of theoretical formulas.

As a result, these factors make it not easy to enhance the efficiency of diagnosis and sometimes difficult to improve the quality of images.

SUMMARY OF THE INVENTION

It is desirable that the problems described previously are solved.

In one aspect of the invention, the invention provides a magnetic resonance imaging apparatus which performs, so as to collect magnetic resonance signals from a subject in a magnetostatic field space, scanning regarding the subject, the magnetic resonance imaging apparatus including a scanning unit which performs in the magnetostatic field space the scanning by executing, after executing a preparation pulse sequence to transmit preparation pulses, an imaging pulse sequence to collect magnetic resonance signals from the subject, wherein the scanning unit, in executing the preparation pulse sequence, excites a spin of the subject by successively transmitting a first chemical saturation pulse, a T2 preparation pulse and a second chemical saturation pulse, which is a reversed pulse; transmits a first killer gradient pulse after transmitting the first chemical saturation pulse and before transmitting the T2 preparation pulse; transmits a second killer gradient pulse after transmitting the T2 preparation pulse and before transmitting the second chemical saturation pulse; and transmits a third killer gradient pulse after transmitting the second chemical saturation pulse and before executing the imaging pulse sequence.

Preferably, the scanning unit may so transmit the first chemical saturation pulse as to make the absolute value of the flip angle 90°, and so transmit the second chemical saturation pulse as to make the absolute value of the flip angle 180°.

Preferably, the scanning unit may so transmit the first killer gradient pulse, the second killer gradient pulse and the third killer gradient pulse as to differ in magnitude from one another.

Preferably, the scanning unit may so transmit the first killer gradient pulse, the second killer gradient pulse and the third killer gradient pulse as to differ in axial direction from one another.

Preferably, the scanning unit may so transmit the first chemical saturation pulse and the second chemical saturation pulse that, in water and fat contained in the subject, the magnetic resonance signals deriving from the fat are more restrained than the magnetic resonance signals deriving from the water.

Preferably, the scanning unit may successively transmit as the T2 preparation pulses, a 90° RF pulse, a first 180° RF pulse, a second 180° RF pulse, a first −180° RF pulse, a second −180° RF pulse and a −90° RF pulse.

Preferably, the scanning unit may so transmit the T2 preparation pulses that the phases of the first 180° RF pulse, the second 180° RF pulse, the first −180° RF pulse and the second −180° RF pulse orthogonally cross the phases of the 90° RF pulse and the −90° RF pulse, respectively.

Preferably, the scanning unit may so transmit the T2 preparation pulses that, compared with a first interval of time between the center point of time of the period during which the 90° RF pulse is transmitted and the center point of time of the period during which the first 180° RF pulse is transmitted, a second interval of time between the center point of time of the period during which the 90° RF pulse is transmitted and the center point of time of the period during which the first 180° RF pulse is transmitted is made twice as long; a third interval of time between the center point of time of the period during which the second 180° RF pulse is transmitted and the center point of time of the period during which the first −180° RF pulse is transmitted is made twice as long; a fourth interval of time between the center point of time of the period during which the first −180° RF pulse is transmitted and the center point of time of the period during which the second −180° RF pulse is transmitted is made twice as long; and a fifth interval of time between the center point of time of the period during which the second −180° RF pulse is transmitted and the center point of time of the period during which the −90° RF pulse is transmitted is made equal in length.

Preferably, the scanning unit may transmit each of the 90° RF pulse, the first 180° RF pulse, the second 180° RF pulse, the first −180° RF pulse, the second −180° RF pulse and the −90° RF pulse as a rectangular pulse.

Preferably, the scanning unit, as the imaging pulse sequence, may repeatedly transmit to the subject RF pulses in such a repeat time that the longitudinal magnetization and transverse magnetization of the spin constitute a steady state in the subject, and so transmit a slice selecting gradient pulse for selecting the slice of the subject excited by the RF pulses, a phase encoding gradient pulse for phase-encoding magnetic resonance signals generated in the slice excited by the RF pulses, and a frequency encoding gradient pulse for frequency-encoding magnetic resonance signals generated in the slice excited by those RF pulses as to make the time integral within the repeat time zero.

Preferably, the preparation pulse sequence may be executed by so transmitting the first killer gradient pulse, the second killer gradient pulse and the third killer gradient pulse as to differ in magnitude from one another.

Preferably, the preparation pulse sequence may be executed by so transmitting the first killer gradient pulse, the second killer gradient pulse and the third killer gradient pulse as to differ in axial direction from one another.

In another aspect of the invention, the invention also provides a magnetic resonance image generating method wherein, on the basis of magnetic resonance signals collected from a subject by scanning performed regarding the subject in a magnetostatic field space, a magnetic resonance image of the subject is generated, wherein the scanning is carried out by executing, after executing a preparation pulse sequence to transmit preparation pulses, an imaging pulse sequence to collect magnetic resonance signals from the subject, the preparation pulse sequence is executed by exciting a spin of the subject by successively transmitting a first chemical saturation pulse, a T2 preparation pulse and a second chemical saturation pulse, which is a reversed pulse; transmitting a first killer gradient pulse after transmitting the first chemical saturation pulse and before transmitting the T2 preparation pulse; transmitting a second killer gradient pulse after transmitting the T2 preparation pulse and before transmitting the second chemical saturation pulse; and transmitting a third killer gradient pulse after transmitting the second chemical saturation pulse and before executing the imaging pulse sequence.

Preferably, the preparation pulse sequence may be executed by so transmitting the first chemical saturation pulse as to make the absolute value of the flip angle 90°, and so transmitting the second chemical saturation pulse as to make the absolute value of the flip angle 180°.

Preferably, the preparation pulse sequence may be executed by so transmitting the first chemical saturation pulse and the second chemical saturation pulse that, in water and fat contained in the subject, the magnetic resonance signals deriving from the fat are more restrained than the magnetic resonance signals deriving from the water.

Preferably, the preparation pulse sequence may be executed by successively transmitting as the T2 preparation pulses, a 90° RF pulse, a first 180° RF pulse, a second 180° RF pulse, a first −180° RF pulse, a second −180° RF pulse and a −90° RF pulse.

Preferably, the preparation pulse sequence may be executed by so transmitting the T2 preparation pulses that the phases of the first 180° RF pulse, the second 180° RF pulse, the first 180° RF pulse and the second −180° RF pulse orthogonally cross the phases of the 90° RF pulse and the −90° RF pulse, respectively.

Preferably, the preparation pulse sequence may be executed by so transmitting the T2 preparation pulses that, compared with a first interval of time between the center point of time of the period during which the 90° RF pulse is transmitted and the center point of time of the period during which the first 180° RF pulse is transmitted, a second interval of time between the center point of time of the period during which the 90° RF pulse is transmitted and the center point of time of the period during which the first 180° RF pulse is transmitted is made twice as long; a third interval of time between the center point of time of the period during which the second 180° RF pulse is transmitted and the center point of time of the period during which the first −180° RF pulse is transmitted is made twice as long; a fourth interval of time between the center point of time of the period during which the first −180° RF pulse is transmitted and the center point of time of the period during which the second −180° RF pulse is transmitted is made twice as long; and a fifth interval of time between the center point of time of the period during which the second −180° RF pulse is transmitted and the center point of time of the period during which the −90° RF pulse is transmitted is made equal in length.

Preferably, the preparation pulse sequence may be executed by transmitting each of the 90° RF pulse, the first 180° RF pulse, the second 180° RF pulse, the first −180° RF pulse, the second −180° RF pulse and the −90° RF pulse as a rectangular pulse.

Preferably, the imaging pulse sequence may be executed by repeatedly transmitting to the subject RF pulses in such a repeat time that the longitudinal magnetization and transverse magnetization of the spin constitute a steady state in the subject, and so transmitting a slice selecting gradient pulse for selecting the slice of the subject excited by the RF pulses, a phase encoding gradient pulse for phase-encoding magnetic resonance signals generated in the slice excited by the RF pulses, and a frequency encoding gradient pulse for frequency-encoding magnetic resonance signals generated in the slice excited by those RF pulses as to make the time integral within the repeat time zero.

According to the invention, a magnetic resonance imaging apparatus and a magnetic resonance image generating method that permit enhancement of the efficiency of diagnosis and improvement of the quality of images can be provided.

Further objects and advantages of the present invention will be apparent from the following description of the preferred embodiments of the invention as illustrated in the accompanying drawings.

BRIEF DESCRIPTION OF THE DRAWINGS

FIGS. 8(a), 8(b), and 8(c) are graphs showing the preparation pulse sequence PS uses both the T2 preparation pulse PR and the chemical saturation pulse CS for restraining fat as preparation pulses and the imaging pulse sequence IS to be executed after that.

DETAILED DESCRIPTION OF THE INVENTION (Hardware configuration) FIG. 1 is a configurational diagram showing the configuration of a magnetic resonance imaging apparatus 1 in a mode for implementing the invention.

Figure 1:
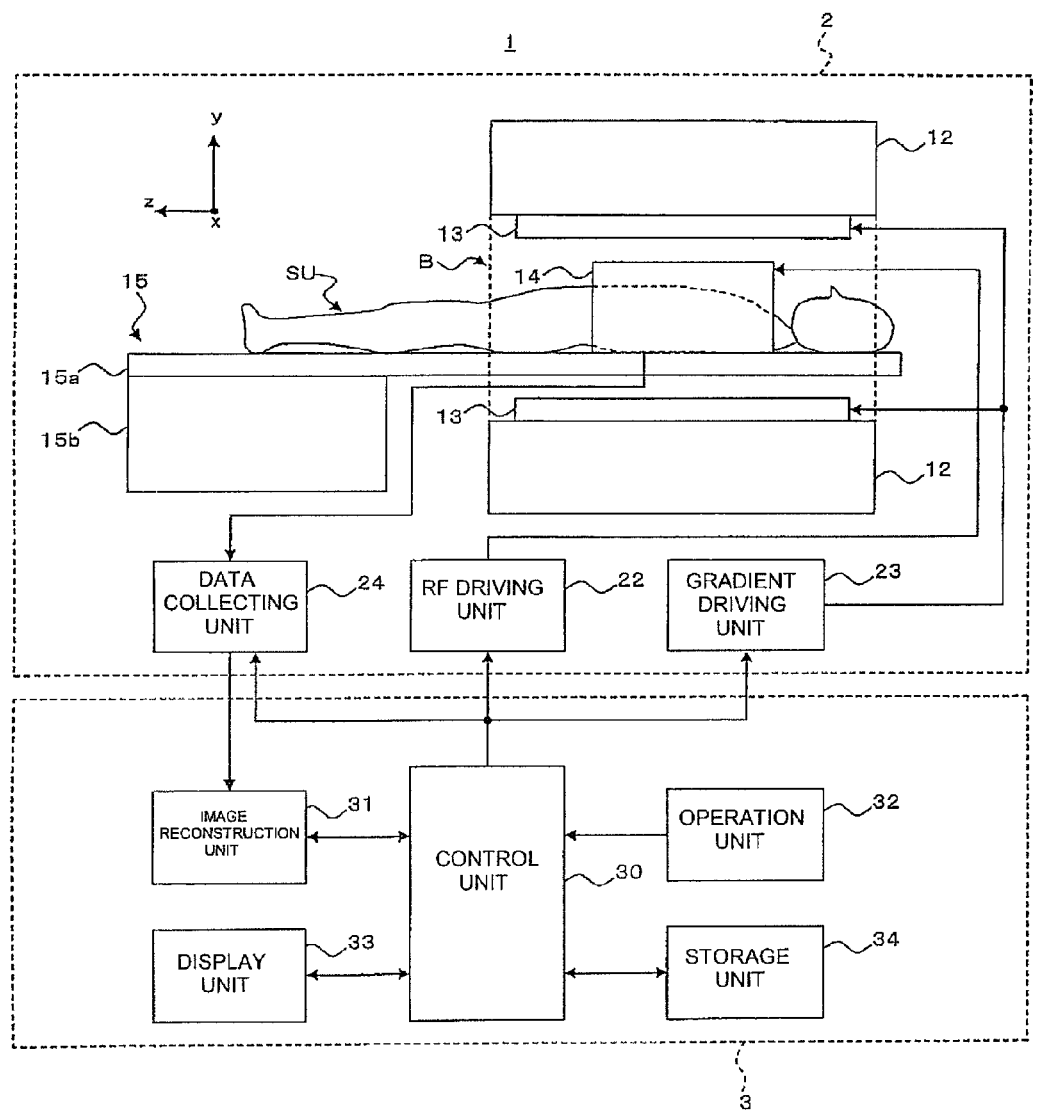
FIG. 1 is a configurational diagram showing the configuration of the magnetic resonance imaging apparatus 1 in a mode for carrying Out the invention.

The magnetic resonance imaging apparatus 1 in this mode for implementation, having a scanning unit 2 and an operation console unit 3 as shown in FIG. 1, scans a subject SU and then generates a magnetic resonance image of the subject SU using as raw data the magnetic resonance signals obtained by the scanning.

The scanning unit 2 here has a magnetostatic field magnet unit 12, a gradient coil unit 13, an RF coil unit 14, a subject moving unit 15, an RF driving unit 22, a gradient driving unit 23 and a data collecting unit 24 as shown in FIG. 1. The operation console unit 3 has a control unit 30, an image reconstruction unit 31, an operation unit 32, a display unit 33 and a storage unit 34 as shown in FIG. 1. In FIG. 1, parts corresponding to the magnetostatic field magnet unit 12 and the gradient coil unit 13 are represented by faces cut along a plane in the y direction.

The scanning unit 2 will be described.

The scanning unit 2 includes an imaging space B in which a magnetostatic field is formed as shown in FIG. 1, and accommodates the subject SU in that imaging space B. The scanning unit 2 is formed to have a cylindrical shape, for instance, and the columnar space in its central part is used as the imaging space B to accommodate the subject SU. And the scanning unit 2 transmits RF pulses so as to excite a spin of the subject SU in the imaging space B accommodating that subject SU, at the same time executes the imaging pulse sequence IS by transmitting gradient pulses, and collects magnetic resonance signals generated in that subject SU.

In this mode for implementation, the scanning unit 2 executes, before the execution of this imaging pulse sequence IS, the preparation pulse sequence PS of transmitting preparation pulses in the imaging space B.

Whereas details will be described afterwards, in executing this preparation pulse sequence PS, the scanning unit 2 excites a spin of the subject SU by successively transmitting a first chemical saturation pulse, a T2 preparation pulse and a second chemical saturation pulse, which is a reversed pulse. Along with that, after transmitting the first chemical saturation pulse and before transmitting the T2 preparation pulse, it transmits a first killer gradient pulse. It also transmits a second killer gradient pulse after transmitting the T2 preparation pulse and before transmitting the second chemical saturation pulse. It further transmits a third killer gradient pulse after transmitting the second chemical saturation pulse and before transmitting the imaging pulse sequence IS. The scanning unit 2 so transmits here the first killer gradient pulse, the second killer gradient pulse and the third killer gradient pulse as to be different in at least one of the size and the axial direction.

After that, the scanning unit 2 executes the imaging pulse sequence IS by one of SSFP (Steady State Free Precession) type imaging methods known as, for instance, FIESTA, True FISP and Balanced TFE.

The individual constituent units of the scanning unit 2 will be described below in succession.

The magnetostatic field magnet unit 12 is a horizontal magnetic field unit, for instance, and its superconducting magnet (not shown) forms a magnetostatic field in the imaging space B in which the subject SU is accommodated in the direction of the body axis of the subject SU. The magnetostatic field magnet unit 12 may as well be a vertical, instead of horizontal, magnetic field unit, and the magnetostatic field may be formed in the direction in which a pair of permanent magnets face each other.

The gradient coil unit 13, by transmitting gradient pulses to the imaging space B in which a magnetostatic field is formed thereby to form a gradient magnetic field, adds spatial positional information to the magnetic resonance signals received by the RF coil unit 14. The gradient coil unit 13 here consists of three lines to form the gradient magnetic fields to match the three mutually orthogonal axial directions including the x direction, the y direction and the z direction. They form gradient magnetic fields by transmitting gradient pulses in each of the frequency encoding direction, the phase encoding direction and the slice selecting direction in accordance with control signals from the control unit 30. More specifically the gradient coil unit 13, by transmitting a gradient pulse in the slice selecting direction of the subject SU, selects a slice of the subject SU that the RF coil unit 14 excites by transmitting an RF pulse. Also, the gradient coil unit 13 phase-encodes the magnetic resonance signals from the slice excited by the RF pulse by transmitting a gradient pulse in the phase encoding direction of the subject SU. And the gradient coil unit 13, by transmitting a gradient pulse in the frequency encoding direction of the subject SU, frequency-encodes the magnetic resonance signals from the slice excited by the RF pulse.

The RF coil unit 14, as shown in FIG. 1, is so arranged as to surround the subject SU. The RF coil unit 14 transmits in accordance with a control signal from the control unit 30 the RF pulse, which is an electromagnetic wave, to the imaging space B in which a magnetostatic field is formed by the magnetostatic field magnet unit 12 and thereby forms a high frequency magnetic field. This causes a spin of protons in the subject SU to be excited. And the IU coil unit 14 transmits as magnetic resonance signals the electromagnetic wave generated when the excited spin of protons returns to the original magnetization vector.

In the subject moving unit 15 having a cradle 15a and a cradle moving unit 15b, the cradle 15a moves the cradle moving unit 15b between inside and outside the imaging space B in accordance with a control signal from the control unit 30. Here, the cradle 15a is a table having a mount face on which the subject SU is to be mounted, and moved by the cradle moving unit 15b in the horizontal direction xz and the vertical direction y as shown in FIG. 1, is moved in and out of the imaging space B in which a magnetostatic field is formed. The cradle moving unit 15b moves the cradle 15a and causes it to be accommodated into the imaging space B from outside. The cradle moving unit 15b is equipped with a roller type driving mechanism, for instance, which drives rollers with an actuator to move the cradle 15a in the horizontal direction xz. The cradle moving unit 15b is equipped with an arm type driving mechanism, for instance, which moves the cradle 15a in the vertical direction y by varying the angle between two crossing arms.

The RF driving unit 22 transmits the RF pulse into the imaging space B by driving the RF coil unit 14 and thereby forms a high frequency magnetic field. The RF driving unit 22, after modulating a signal from an RF oscillator into a signal of a prescribed timing and a prescribed envelope by using a gate modulator in accordance with a control signal from the control unit 30, amplifies with an RF power amplifier that signal modulated by the gate modulator and outputs it to the RF coil unit 14 to cause an RF pulse to be transmitted.

The gradient driving unit 23, by driving the gradient coil unit 13 in accordance with a control signal from the control unit 30, generates a gradient magnetic field in the imaging space B in which a magnetostatic field is formed. The gradient driving unit 23 has three lines of driving circuits (not shown) matching the three lines of the gradient coil unit 13.

The data collecting unit 24, in accordance with a control signal from the control unit 30, collects magnetic resonance signals received by the RF coil unit 14. Here in the data collecting unit 24, a phase detector phase-detects the magnetic resonance signals received by the RF coil unit 14 with the output of the RF oscillator of the RF driving unit 22 as the reference signal. After that, these magnetic resonance signals that are analog signals are converted into digital signals by using an A/D converter and outputted.

The operation console unit 3 will be described.

The operation console unit 3 so performs control that the scanning unit 2 executes a scan with respect to the subject, generates an image of the subject on the basis of the magnetic resonance signals obtained by that scan executed by the scanning unit 2 and displays the generated image.

The individual constituent units of the operation console unit 3 will be described below in succession.

The control unit 30, having a computer and a memory storing programs to cause the computer to perform prescribed data processing, controls the constituent units. Here the control unit 30, to which operational data are inputted from the operation unit 32, generates control signals on the basis of those operational data inputted from the operation unit 32. For instance, the control unit 30 generates a control signal for controlling the scanning unit 2 on the basis of operational data. After that, it outputs the generated control signal to the scanning unit 2 to control the scanning unit 2. Thus, as shown in FIG. 1, it outputs a control signal to each of the RF driving unit 22, the gradient driving unit 23 and the data collecting unit 24 to so control the operation of each unit as to match the set scanning conditions. Along with that, it outputs control signals to the image reconstruction unit 31, the display unit 33 and the storage unit 34 to control them.

The image reconstruction unit 31, having a computer and a memory storing programs to cause the computer to perform prescribed data processing, executes image reconstruction processing in accordance with control signals from the control unit 30 to reconstruct an image regarding the subject. Here, execution of a scan by the scanning unit 2 regarding an imaging area thereby to execute Fourier transform processing on magnetic resonance signals so collected as to match a k space constitutes performance of image reconstruction processing to reconstruct a slice image of this subject. Thus, the image reconstruction unit 31 generates the slice image from the magnetic resonance signals collected by the scanning unit 2 as raw data. And the image reconstruction unit 31 outputs to the display unit 33 the data of that reconstructed image.

The operation unit 32 includes operating devices such as a keyboard and a pointing device, and the operator carries out the operation of various units by inputting operational data to a plurality of input items by using the operating devices. The operation unit 32 here is a so-called graphical user interface, which displays on the display unit 33 a screen indicating input items, and the operator watching the screen inputs operational data. And the operator carries out operation by outputting those operational data to the control unit 30. More specifically, the operation unit 32 has as these input items the scan parameters of the scan to be executed by the scanning unit 2, and the operational data are so inputted as to match the scan parameters. The operation unit 32 has subject information on the subject to be scanned by the scanning unit 2 as its input items, and the operational data are so inputted as to match the subject information.

The display unit 33, composed of a display device including a monitor such as an LCD (liquid crystal display), displays on its display screen an image in accordance with control signals from the control unit 30. For instance, the display unit 33 displays side by side on its display screen a plurality of images including one showing the input items of the operational data inputted by the operator to the operation unit 32 and another showing a dialog box for inputting those operational data. More specifically, the display unit 33 displays scan parameters including the number of echoes, echo duration, repeat time and band width, a dialog box to which subject information including the name and body weight of the subject is inputted, and buttons for instructing a shift of the cradle and instructing the start of scanning, and each input item is displayed correspondingly on the display screen as character information. Also the display unit 33, receiving image data of the imaging area reconstructed by the image reconstruction unit 31, displays their image on the display screen. Thus, the display unit 33 displays a magnetic resonance image, reconstructed as a medical image, on the display screen.

The storage unit 34, composed of a storage device such as a memory, stores various sets of data. The storage unit 34 is accessed by the control unit 30 as required for the data stored therein.

(Operation) The operation to pick up an image of a subject SU by using the magnetic resonance imaging apparatus 1 in the above-stated mode for implementing the invention will be described below.

Figure 2:
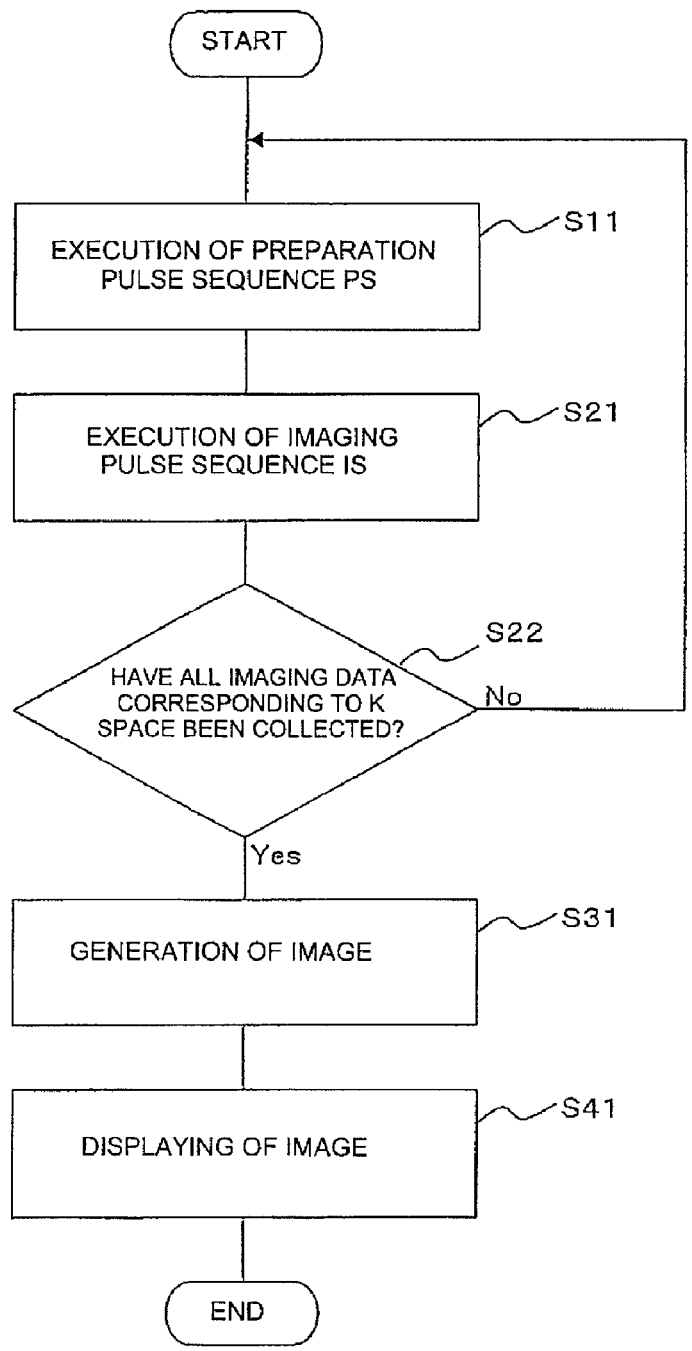
FIG. 2 is a flow chart of the operation performed when picking up an image of the subject SU in Implementation Mode 1 for the invention.

FIG. 2 is a flow chart of the operation performed when picking up an image of the subject SU in Implementation Mode 1 for the invention.

First, as charted in FIG. 2, the preparation pulse sequence PS is executed (S11).

Here, the scanning unit 2 executes the preparation pulse sequence PS.

Figure 3:
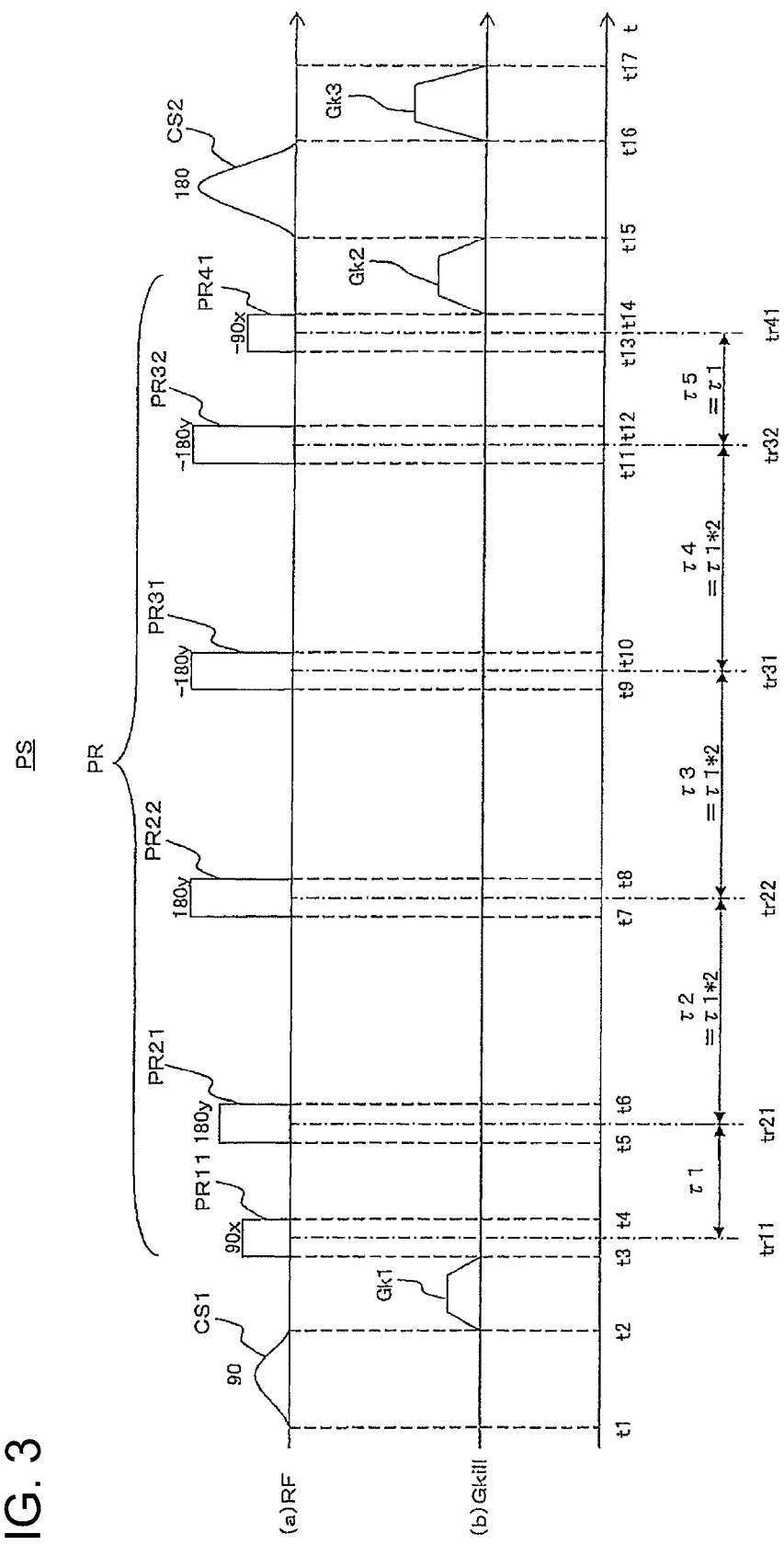
FIG. 3 is a pulse sequence diagram showing the preparation pulse sequence PS in Implementation Mode 1 for the invention.

FIG. 3 is a pulse sequence diagram showing the preparation pulse sequence PS in Implementation Mode 1 for the invention.

In FIG. 3, (a) is the time axis of transmitting the RF pulses RF and (b), the time axis of transmitting the killer gradient pulses Gkill as the gradient pulses, for each of which the horizontal axis represents the time t and the vertical axis, the pulse intensity. Herein, Gkill represents at least one axial direction out of the slice selecting direction, the phase encoding direction and the frequency encoding direction. In the following description, the time integral is an integral defined by the pulse intensity and the time t.

As indicated by (a) and (b) in FIG. 3, in executing the preparation pulse sequence PS, a spin of the subject SU is excited by successively transmitting a first chemical saturation pulse CS1, the T2 preparation pulse PR and a second chemical saturation pulse CS2, which is a reversed pulse. Along with this, a first killer gradient pulse Gk1 is transmitted after transmitting the first chemical saturation pulse CS1 and before transmitting the T2 preparation pulse PR, a second killer gradient pulse Gk2 is transmitted after transmitting the T2 preparation pulse PR and before transmitting the second chemical saturation pulse CS2, and a third killer gradient pulse Gk3 is transmitted after transmitting the second chemical saturation pulse CS2 and before transmitting the imaging pulse sequence IS to be described afterwards.

More specifically, as shown in FIG. 3, first the first chemical saturation pulse CS1 is transmitted.

Here, this first chemical saturation pulse CS1 is transmitted between a first point of time t1 and a second point of time t2. It is so transmitted as to make, for instance, the absolute value of the flip angle 90° and the length of time between the first point of time t1 and the second point of time t2 8 msec. In this mode for implementation, the first chemical saturation pulse CS1 is so transmitted that, in water and fat contained in the subject SU, the magnetic resonance signals deriving from the fat are more restrained than the magnetic resonance signals deriving from the water. Namely, a frequency-selective RF pulse is transmitted to saturate the fat.

Next, the first killer gradient pulse Gk1 is transmitted as shown in FIG. 3.

Here, this first killer gradient pulse Gk1 is so transmitted between the second point of time t2 and a third point of time t3 as to generate a gradient magnetic field which causes the transverse magnetization of the spin to disappear. It is so transmitted as to make, for instance, the length of time between the second point of time t2 and the third point of time t3 5 msec.

Next, the T2 preparation pulse PR is transmitted as shown in FIG. 3.

Here, T2 preparation pulses PR are so transmitted as to match the MLEV-4 method. More specifically, as the T2 preparation pulses PR, a 90° RF pulse PR11, a first 180° RF pulse PR21, a second 180° RF pulse PR22, a first −180° RF pulse PR31, a second −180° RF pulse PR32 and a −90° RF pulse PR41 are successively transmitted each for a 50 msec duration of application (also known as TE or time of echo). In this mode for implementation, the 90° RF pulse PR11, the first 180° RF pulse PR21, the second 180° RF pulse PR22, the first 180° RF pulse PR31, the second −180° RF pulse PR32 and the 90° RF pulse PR41 are transmitted as rectangular pulses.

Further, these T2 preparation pulses PR here are so transmitted that the phases of the first 180° RF pulse PR21 and the second 180° RF pulse PR22 orthogonally cross the phase of the 90° RF pulse PR11 and the phases of the first −180° RF pulse PR31 and the second −180° RF pulse PR32 orthogonally cross the phase of the −90° RF pulse PR41.

And the T2 preparation pulses PR are so transmitted as to make the ratio of time intervals between the 90° RF pulse PR11, the first 180° RF pulse PR21, the second 180° RF pulse PR22, the first −180° RF pulse PR31, the second −180° RF pulse PR32 and the −90° RF pulse PR41 1:2:2:2:1.

Thus, when the T2 preparation pulse PR is to be transmitted, first the 90° RF pulse PR11 is so transmitted as to flip a spin with its phase in the x direction and at a flip angle of 90° as shown in FIG. 3.

Here, this 90° RF pulse PR11 is transmitted in the period from the third point of time t3 when the transmission of the first killer gradient pulse Gk1 has been completed until a fourth point of time t4 a prescribed interval afterwards.

This causes a spin of the subject to be flipped at a flip angle of 90° along the yz plane containing the z direction in which a magnetostatic field is formed and the y direction orthogonal to that z direction. In other words, the spin of the subject is turned by 90° around the x direction as the center axis.

Next, as shown in FIG. 3, the first 180° RF pulse PR21 is so transmitted as to cause a spin to be flipped with its phase being in the y direction orthogonal to the x direction at a flip angle of 180°.

Here, the transmission of this first 180° RF pulse PR21 is started at a fifth point of time t5 a prescribed interval after the fourth point of time t4 when the transmission of the 90° RF, pulse PR11 has been completed, and this first 180° RF pulse PR21 is transmitted from that fifth point of time t5 until a sixth point of time t6 a prescribed interval afterwards.

Next, as shown in FIG. 3, the second 180° RF pulse PR22 is so transmitted as to cause a spin to be flipped with its phase being in the y direction at a flip angle of 180°.

Here, the transmission of this second 180° RF pulse PR22 is started at a seventh point of time t7 a prescribed interval after the sixth point of time t6 when the transmission of the first 180° RF pulse PR21 has been completed, and this second 180° RF pulse PR22 is transmitted from that seventh point of time t7 until an eighth point of time t8 a prescribed interval afterwards.

More specifically, as shown in FIG. 3, the second 180° RF pulse PR22 is so transmitted as to make a second interval of time τ2 between the center point of time tr21 of the period during which the first 180° RF pulse PR21 is transmitted (t5 to t6) and the center point of time tr22 of the period during which the second 180° RF pulse PR22 is transmitted (t7 to t8) twice as long as a first interval of time τ1 between the center point of time tr11 of the period during which the 90° RF pulse PR11 is transmitted (t3 to t4) and the center point of time tr21 of the period during which the first 180° RF pulse PR21 is transmitted (t5 to t6).

Next, as shown in FIG. 3, the first −180° RF pulse PR31 is so transmitted as to cause a spin to be flipped with its phase being in the y direction at a flip angle of −180°.

Here, the transmission of this first −180° RF pulse PR31 is started at a ninth point of time t9 a prescribed interval after the eighth point of time t8 when the transmission of the second 180° RF pulse PR22 has been completed, and this first −180° RF pulse PR31 is transmitted from the ninth point of time t9 until a 10th point of time t10 a prescribed interval afterwards.

More specifically, as shown in FIG. 3, the first −180° RF pulse PR31 is so transmitted as to make a third interval of time τ3 between the center point of time tr22 of the period during which the second 180° RF pulse PR22 is transmitted (t7 to t8) and the center point of time tr31 of the period during which the first −180° RF pulse PR31 is transmitted (t9 to t10) twice as long as the first interval of time τ1 between the center point of time tr11 of the period during which the 90° RF pulse PR11 is transmitted (t3 to t4) and the center point of time tr21 of the period during which the first 180° RF pulse PR21 is transmitted (t5 to t6).

Next, as shown in FIG. 3, the second −180° RF pulse PR32 is so transmitted as to cause a spin to be flipped with its phase being in the y direction at a flip angle of −180°.

Here, the transmission of this second −180° RF pulse PR32 is started at an 11th point of time t11 a prescribed interval after the 10th point of time t10 when the transmission of the first −180° RF pulse PR31 has been completed, and this second 180° RF pulse PR22 is transmitted from that 11th point of time t11 until a 12th point of time t12 a prescribed interval afterwards.

More specifically, as shown in FIG. 3, the second −180° RF pulse PR32 is so transmitted as to make a fourth interval of time τ4 between the center point of time tr31 of the period during which the first −180° RF pulse PR31 is transmitted (t9 to t10) and the center point of time tr32 of the period during which the second −180° RF pulse PR32 is transmitted (t11- t12) twice as long as the first interval of time τ1 between the center point of time tr11 of the period during which the 90° RF pulse PR11 is transmitted (t3 to t4) and the center point of time tr21 of the period during which the first 180° RF pulse PR21 is transmitted (t5 to t6).

Next, as shown in FIG. 3, the −90° RF pulse PR41 is so transmitted as to cause a spin to be flipped with its phase being in the x direction at a flip angle of −90°.

Here, the transmission of this −90° RF pulse PR41 is started at a 13th point of time t13 a prescribed interval after the 12th point of time t12 when the transmission of the second −180° RF pulse PR32 has been completed, and this −90° RF pulse PR41 is transmitted from that 13th point of time t13 until a 14th point of time t14 a prescribed interval afterwards.

More specifically, as shown in FIG. 3, the −90° RF pulse PR41 is so transmitted as to make a fifth interval of time τ5 between the center point of time tr32 of the period during which the second −180° RF pulse PR32 is transmitted (t11 to t12) and the center point of time tr41 of the period during which the −90° RF pulse PR41 is transmitted (t13-t14) twice as long as the first interval of time τ1 between the center point of time tr11 of the period during which the 90° RF pulse PR11 is transmitted (t3 to t4) and the center point of time tr21 of the period during which the first 180° RF pulse PR21 is transmitted (t5 to t6).

By transmitting the T2 preparation pulses PR in this way, among a plurality of tissues differing in T2 in the subject, the magnetization moment of tissues longer in T2 can be greater than the magnetization moment of tissues shorter in T2.

Next, as shown in FIG. 3, the second killer gradient pulse Gk2 is transmitted.

Here, this second killer gradient pulse Gk2 is so transmitted between the 14th point of time t14 when the transmission of the T2 preparation pulses PR has been completed and a 15th point of time t15 a prescribed interval afterwards as to generate a gradient magnetic field which causes the transverse magnetization of the spin to disappear. It is so transmitted as to make, for instance, the length of time between the 14th point of time t14 and the 15th point of time t15 5 msec. In this mode for implementation, transmission is so accomplished as to differentiate the magnitude of the second killer gradient pulse Gk2 from that of the first killer gradient pulse Gk1 though in the same axial direction as the first killer gradient pulse Gk1. In other words, when the first killer gradient pulse Gk1 is to be transmitted, transmission is so accomplished as to make the time integral of transmitting the second killer gradient pulse Gk2 differ from the time integral computed from its pulse width and pulse intensity. Incidentally, the second killer gradient pulse Gk2 may be transmitted in a different axial direction from the first killer gradient pulse Gk1.

Next, as shown in FIG. 3, the second chemical saturation pulse CS2 is transmitted.

Here, this second chemical saturation pulse CS2 is transmitted as a reversed pulse in the period from the 15th point of time t15 when the transmission of the second killer gradient pulse Gk2 has been completed until a 16th point of time t16 a prescribed interval afterwards. More specifically, the transmission is so accomplished as to make the interval between the 15th point of time t15 and the 16th point of time t16 8 msec with the absolute value of the flip angle being 180°, and the positivity or negativity of the magnetization moment is reversed. Further in this mode for implementation, the second chemical saturation pulse CS2 is so transmitted that, in water and fat contained in the subject SU, the magnetic resonance signals deriving from the fat are more restrained than the magnetic resonance signals deriving from the water. Namely, a frequency-selective RF pulse is transmitted to saturate the fat.

Next, as shown in FIG. 3, the third killer gradient pulse Gk3 is transmitted.

Here, this third killer gradient pulse Gk3 is so transmitted between the 16th point of time t16 when the transmission of the second chemical saturation pulse CS2 has been completed and a 17th point of time t17 a prescribed interval afterwards as to generate a gradient magnetic field which causes the transverse magnetization of the spin to disappear. In this mode for implementation, transmission is so accomplished as to make the pulse width of the second killer gradient pulse Gk2 the same as that of the third killer gradient pulse Gk3. It is so transmitted as to make, for instance, the length of time between the 16th point of time t16 and the 17th point of time t17 5 msec. Further in this mode for implementation, transmission is so accomplished as to differentiate the first killer gradient pulse Gk1, the second killer gradient pulse Gk2 and the third killer gradient pulse Gk3 from one another in magnitude. In other words, transmission is so accomplished as to make the time integral of transmitting the third killer gradient pulse Gk3 differ from the time integral of transmitting the first killer gradient pulse Gk1 and the second killer gradient pulse Gk2. More specifically, as shown in FIG. 3, when the third killer gradient pulse Gk3 is to be so transmitted to have the same pulse width as those of the first killer gradient pulse Gk1 and the second killer gradient pulse Gk2, transmission is so accomplished as to make the pulse intensity of the third killer gradient pulse Gk3 differ from those of the first killer gradient pulse Gk1 and the second killer gradient pulse Gk2. By so accomplishing transmission as to differentiate the time integral of transmitting each of the first killer gradient pulse Gk1, the second killer gradient pulse Gk2 and the third killer gradient pulse Gk3 in this way, the spin echo and the stimulated echo can be prevented from occurring unexpectedly. Incidentally, even when transmission is to be so accomplished as to make the first killer gradient pulse Gk1, the second killer gradient pulse Gk2 and the third killer gradient pulse Gk3 the same as one another in magnitude, a similar effect to the foregoing can be achieved by transmitting the first killer gradient pulse Gk1, the second killer gradient pulse Gk2 and the third killer gradient pulse Gk3 in mutually different axial directions.

After the preparation pulse sequence PS has been executed as described above, the imaging pulse sequence IS is executed as charted in FIG. 2 (S21).

Here, the preparation pulse sequence PS is executed and, after waiting for a prescribed length of preparation time, the scanning unit 2 executes the imaging pulse sequence IS. In this mode for implementation, the imaging pulse sequence IS is executed by an SSFP type imaging method to collect magnetic resonance signals from the subject.

Figure 4:
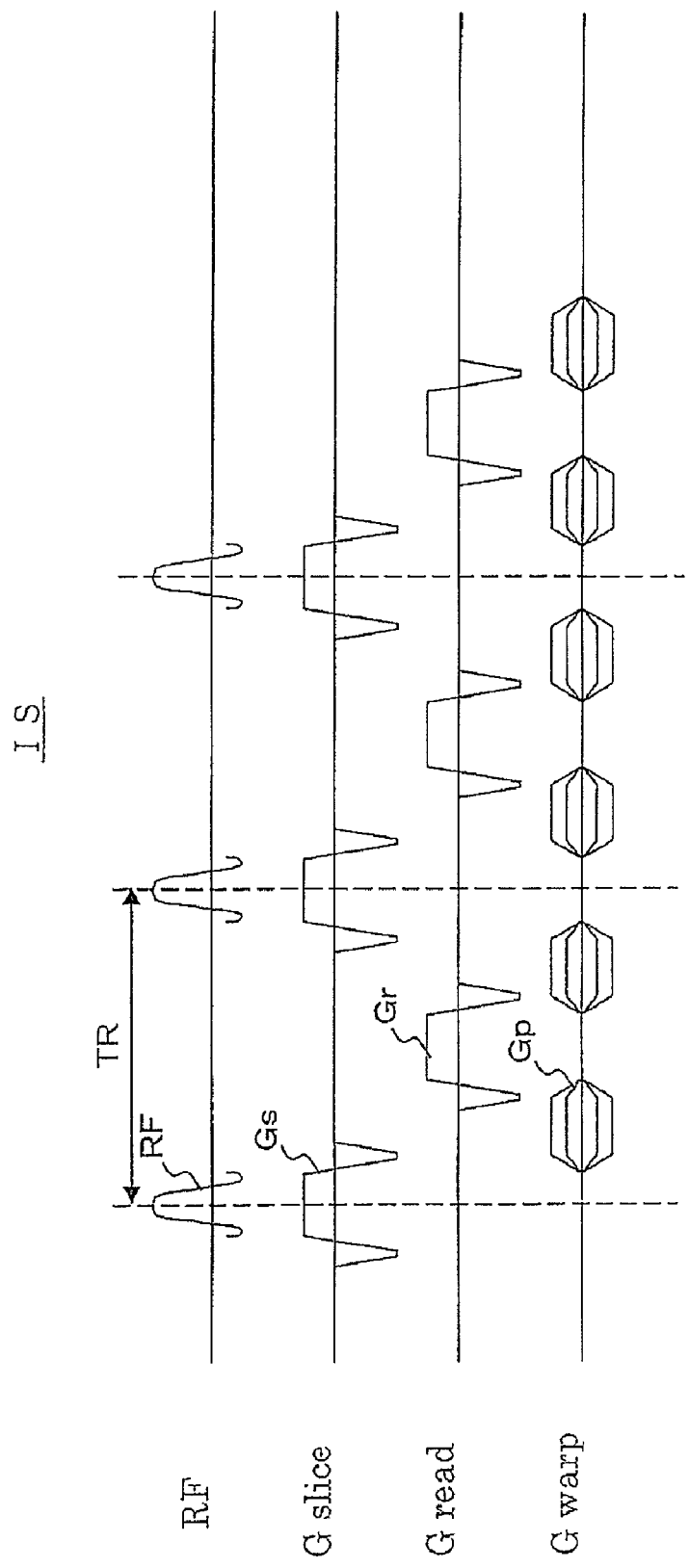
FIG. 4 is a pulse sequence diagram showing the imaging pulse sequence IS to be executed in a mode for implementing the invention.

FIG. 4 is a pulse sequence diagram showing the imaging pulse sequence IS to be executed in a mode for implementing the invention.

In FIG. 4, RF represents the time axis on which RF pulses are transmitted; Gslice, the time axis on which gradient pulses are transmitted in the slice selecting-encoding direction; Gread, the time axis on which gradient pulses are transmitted in the read-out direction; and Gwarp, the time axis on which gradient pulses are transmitted in the phase encoding direction; in every case, the horizontal axis represents the time t and the vertical axis, the pulse intensity.

As shown in FIG. 4, in executing the imaging pulse sequence IS, RF pulses RF are repeatedly transmitted to the subject SU. Here, the scanning unit 2 transmits the RF pulses RF in such a repeat time TR that the longitudinal magnetization and transverse magnetization of the spin constitute a steady state in the subject SU.

Along with that, a slice selecting gradient pulse Gs for selecting the slice of the subject SU excited by that REF pulse RF as an imaging area, a phase encoding gradient pulse Gp for phase-encoding magnetic resonance signals generated in the slice excited by that RF pulse, and a frequency encoding gradient pulse Gr for frequency-encoding magnetic resonance signals generated in the slice excited by that RF pulse are transmitted within the repeat time TR. Here, the slice selecting gradient pulse, the phase encoding gradient pulse and the frequency encoding gradient pulse are so transmitted to the subject SU as to make the time integral within the repeat time TR zero. Thus, as shown in FIG. 4, after collecting magnetic resonance signals as imaging data, transverse magnetization is rewound within the repeat time TR and the phase encoded by the gradient magnetic field is reset.

Next, as shown in FIG. 2, it is judged whether or not all the imaging data corresponding to the k space have been collected (S22).

Here, the control unit 30 judges whether or not all the imaging data corresponding to the k space have been collected.

And if all the imaging data corresponding to the k space have not been collected (No), the execution of the preparation pulse sequence PS (S11) and the execution of the imaging pulse sequence IS (S21) are repeated in succession as shown in FIG. 2. Thus, by repeating the execution of the preparation pulse sequence PS (S11) and the execution of the imaging pulse sequence IS (S21), imaging data are collected until the k space is wholly filled.

On the other hand, if all the imaging data corresponding to the k space have been collected (Yes), an image is generated as shown in FIG. 2 (S31).

Here, using as raw data the imaging data obtained by the scanning unit 2 by executing the imaging pulse sequence IS, the image reconstruction unit 31 reconstricts an image regarding the subject SU.

Next, the image is displayed as shown in FIG. 2(S41).

Here, the display unit 33 receives all the data regarding the image of the subject SU from the image reconstruction unit 31, and displays that image on the display screen.

As described so far, when the preparation pulse sequence PS is executed in this mode for implementation, a spin of the subject SU is excited by successively transmitting the first chemical saturation pulse CS1, the T2 preparation pulse PR and the second chemical saturation pulse CS2, which is a reversed pulse. Along with that, after transmitting the first chemical saturation pulse CS1 and before transmitting the T2 preparation pulse PR, the first killer gradient pulse Gk1 is transmitted; after transmitting the T2 preparation pulse PR and before transmitting the second chemical saturation pulse CS2, the second killer gradient pulse Gk2 is transmitted; and after transmitting the second chemical saturation pulse CS2 and before transmitting the imaging pulse sequence IS, the third killer gradient pulse Gk3 is transmitted. Here, the first chemical saturation pulse CS1 and the second chemical saturation pulse CS2 are so transmitted that, in water and fat contained in the subject SU, the magnetic resonance signals deriving from the fat are selectively more restrained than the magnetic resonance signals deriving from the water. Also, the first chemical saturation pulse CS is so transmitted as to make the absolute value of the flip angle 90°, and the second chemical saturation pulse CS2 is so transmitted as to make the absolute value of the flip angle 180°. Further, the second killer gradient pulse Gk2 and the third killer gradient pulse Gk3 are so transmitted as to make their pulse width the same and thereby to cause them to function as crasher gradient pulses. By doing so, magnetic resonance images having undergone not only fat restraint but also T2 emphasis can be generated without being affected by the non-uniformity of magnetostatic fields.

The behaviors of the magnetization moment of fat when the preparation pulse sequence PS has been executed in the foregoing way will be described.

Figure 5:
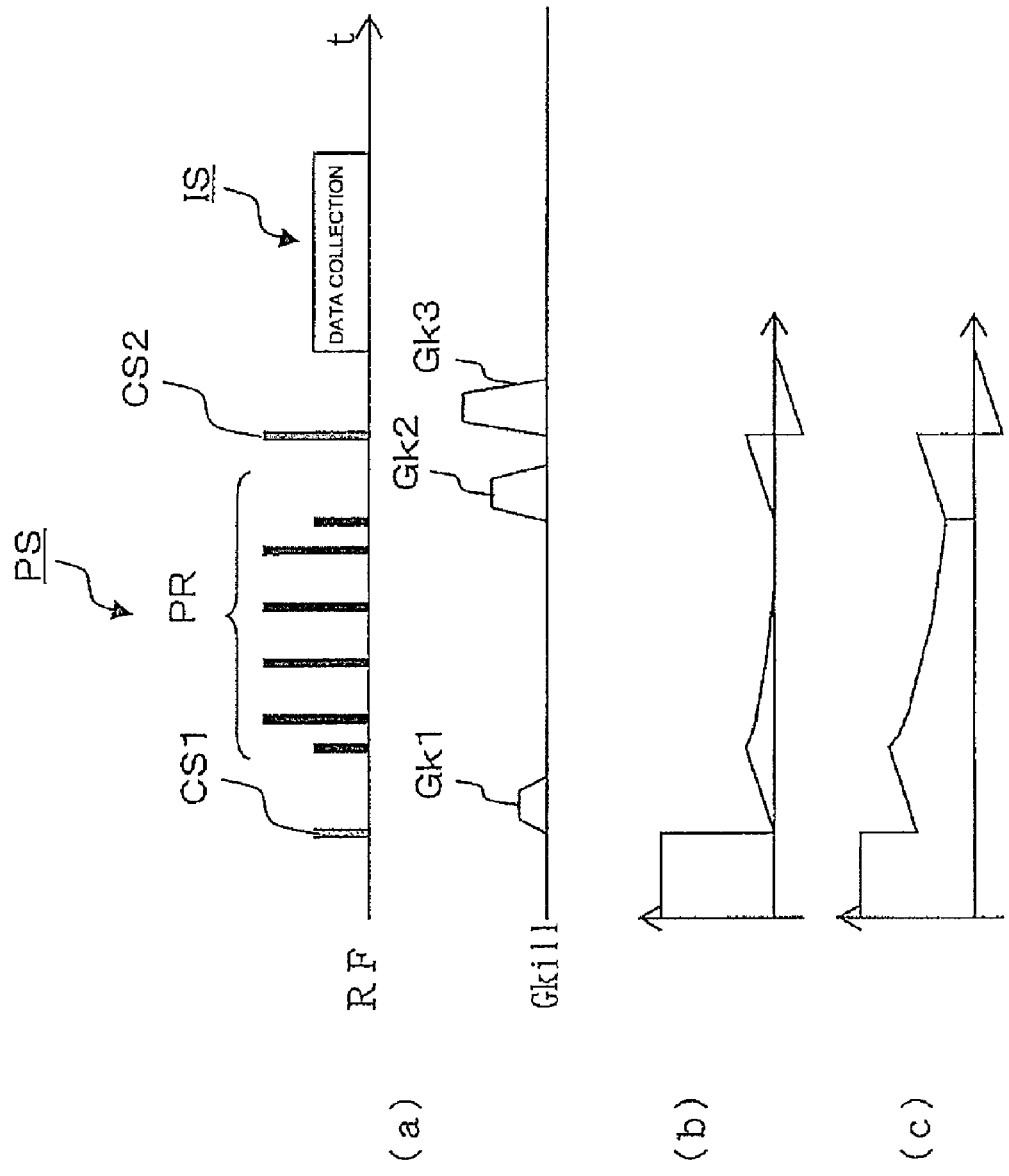
FIGS. 5(a), 5(b), and 5(c) are graphs showing the behaviors of the magnetization moment of fat when the preparation pulse sequence PS is executed in the mode for implementing the invention.

FIGS. 5(a), 5(b), and 5(c) are graphs showing the behaviors of the magnetization moment of fat when the preparation pulse sequence PS is executed in the mode for implementing the invention.

FIG. 5(a) is a pulse sequence chart, wherein the horizontal axis represents the time and the vertical axis, the pulse intensity. And "RF" represents the time axis of transmitting RF pulses and "GKill", the time axis of transmitting killer gradient pulses. FIG. 5(a) schematically illustrates the pulse sequence shown in FIG. 3 and FIG. 4 cited above.

Further FIGS. 5(b) and 5(c) are graphs showing the behaviors of the magnetization moment of fat when the pulse sequence shown in FIG. 5(a) was executed, wherein the horizontal axis represents the time and the vertical axis, the magnetization moment. Here, FIG. 5(b) shows an ideal state in which the magnetostatic field is uniform, while FIG. 5(c) shows an unideal state in which the magnetostatic field is not uniform.

First, whereas the first chemical saturation pulse CS1 whose flip angle is 90° is transmitted as shown in FIG. 5(a) when the preparation pulse sequence PS is to be executed, if the magnetostatic field is in the ideal state in which the magnetostatic field is uniform, the magnetization moment of fat will become 0 as shown in FIG. 5(b). On the other hand, if the magnetostatic field is in the unideal state in which the magnetostatic field is not uniform, the magnetization moment of fat will have a prescribed value as it is not flipped at a flip angle of 90° but is flipped at a flip angle of, for instance, 60° as shown in FIG. 5(c).

Next, when the first killer gradient pulse Gk1 is transmitted as shown in FIG. 5(a), the transverse magnetization of the spin disappears as stated above, but the magnetization moment of fat is recovered over time as shown in FIGS. 5(b) and 5(c).

Next, when the T2 preparation pulse PR is transmitted as shown in FIG. 5(a), the magnetization moment of fat attenuates as shown in FIGS. 5(b) and 5(c).

Next, when the third killer gradient pulse Gk3 is transmitted as shown in FIG. 5(a), the transverse magnetization of the spin generated by the transmission of the second chemical saturation pulse SC disappears as stated above, but the magnetization moment of fat is recovered over time as shown in FIGS. 5(b) and 5(c).

Next, when the second chemical saturation pulse CS2 whose flip angle is 180° is transmitted as shown in FIG. 5(a), if the magnetostatic field is in the ideal state in which the magnetostatic field is uniform, the magnetization moment of fat will have a prescribed value because the longitudinal magnetization is flipped at a flip angle of 180° as shown in FIG. 5(b). On the other hand, if the magnetostatic field is in the unideal state in which the magnetostatic field is not uniform, the magnetization moment of fat will have a prescribed value similar to that in the ideal state because the longitudinal magnetization is flipped at a flip angle of 120°, for instance, instead of 180° as shown in FIG. 5(c).

Next, when the second killer gradient pulse Gk2 is transmitted as shown in FIG. 5(a), the transverse magnetization of the spin generated by the transmission of the chemical saturation pulse RC disappears as stated above, but the magnetization moment of fat is recovered over time as shown in FIGS. 5(b) and 5(c).

As is seen what has been hitherto stated, in this mode for implementation the magnetization moment is recovered in a similar behavior in both cases including the ideal state in which the magnetostatic field is uniform and the unideal state in which the magnetostatic field is not uniform. For this reason, when the imaging pulse sequence IS is executed afterwards as shown in FIG. 5(a), magnetic resonance images having undergone not only appropriate fat restraint but also T2 emphasis can be generated in both cases including the ideal state in which the magnetostatic field is uniform and the unideal state in which the magnetostatic field is not uniform.

Figure 6:
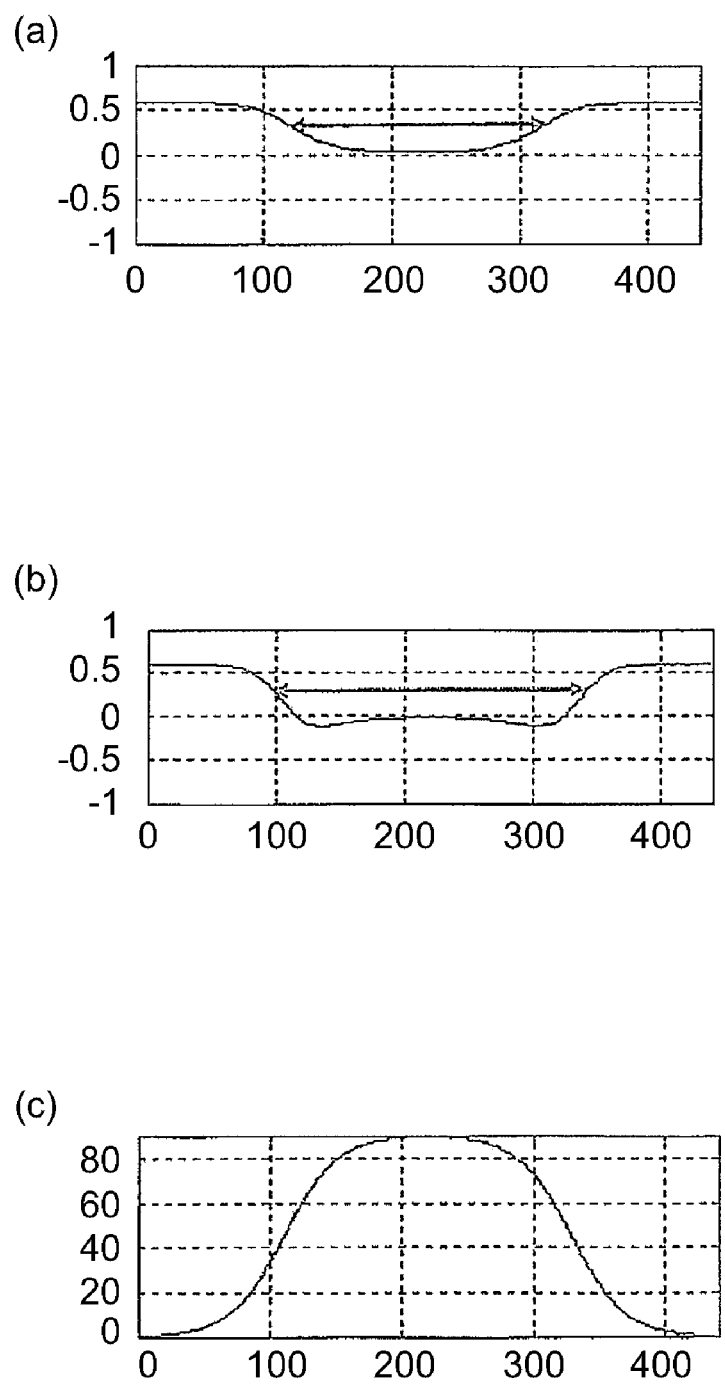
FIGS. 6(a), 6(b), and 6(c) are graphs showing the bandwidths of fat restraining in the mode for implementing the invention.

FIGS. 6(a), 6(b), and 6(c) are graphs showing the bandwidths of fat restraint in the mode for implementing the invention.

FIG. 6(a) shows the result of simulation of a conventional case and FIG. 6(b) shows the result of simulation in this mode for implementation. More specifically, in the conventional case a preparation pulse sequence which is similar to the preparation pulse sequence PS in this mode for implementation except that the first chemical saturation pulse CS1 is not transmitted and the flip angle of the second chemical saturation pulse CS2 is 90° is executed. Further, the simulation was carried out here under the conditions that the chemical saturation pulse was in a Fermi function shape as shown in FIG. 6(c), the offset frequency was −220 Hz, the Fermi radius was 110 Hz, the Fermi width was 20 Hz and the flip angle was 90°.

As shown in FIGS. 6(a), 6(b), and 6(c), the half width in this mode for implementation shown in FIG. 6(b) is greater than the half width in the conventional case shown in FIG. 6(a). It is seen that, for this reason, this mode for implementation is hardly affected by the non-uniformity of the magnetostatic field.

Figure 7:
FIGS. 7(a) and 7(b) are drawings showing reconstructed images in the mode for implementing the invention.
Figure 7:
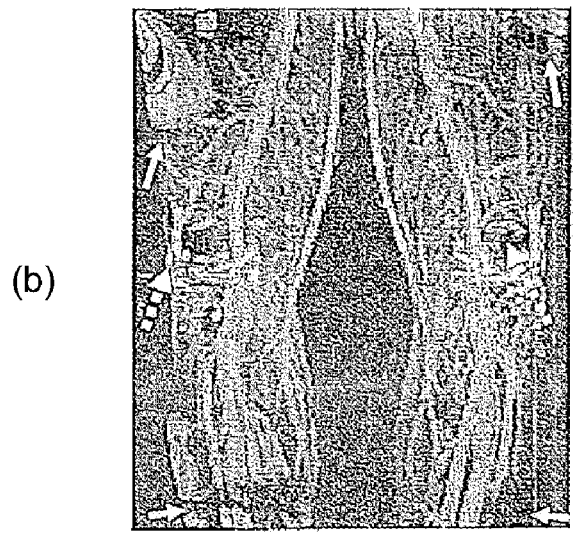
Figure 8:
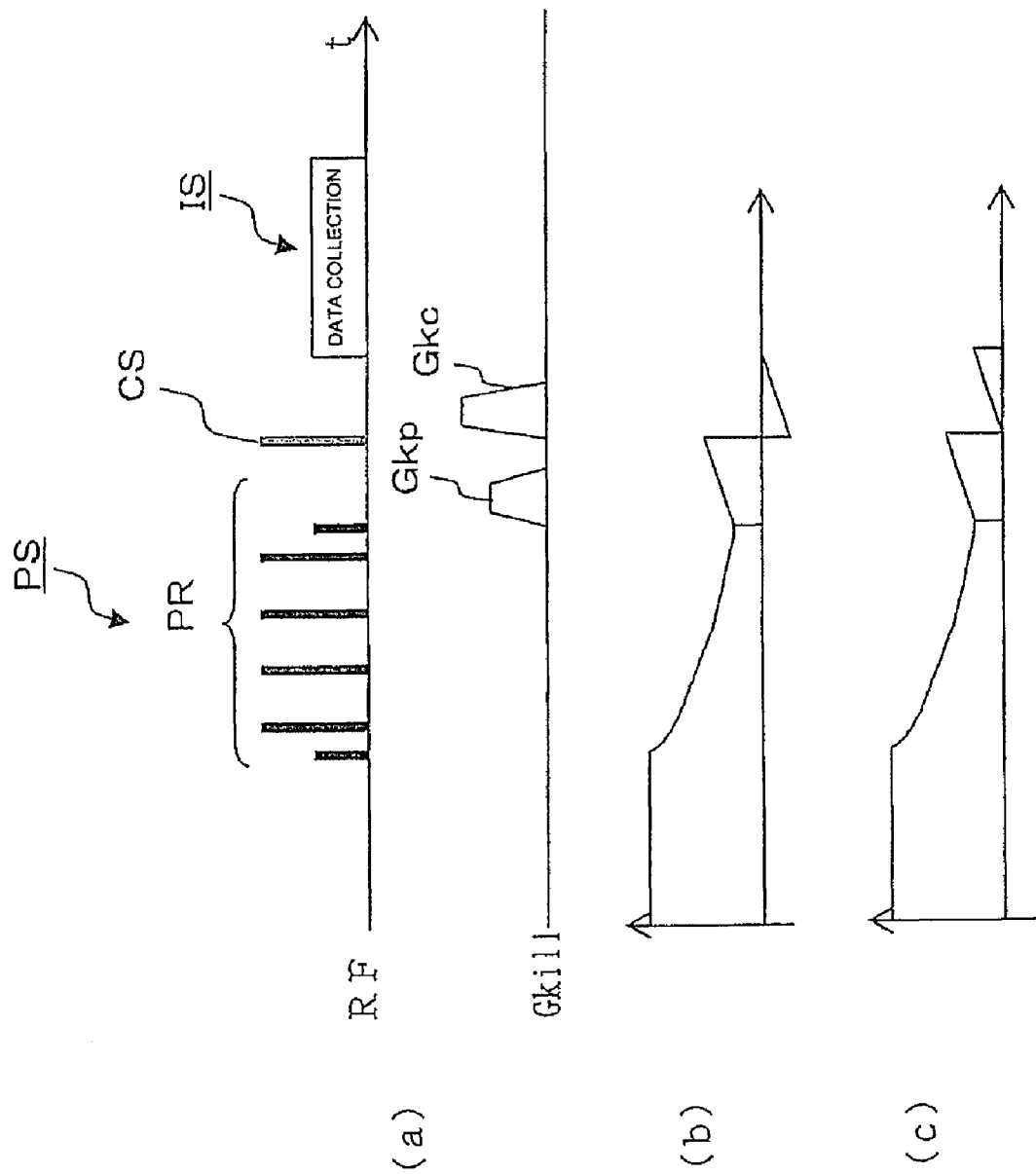

FIGS. 7(a) and 7(b) are drawings showing reconstructed images in the mode for implementing the invention. FIG. 7(a) shows the conventional case and FIG. 7(b) shows the case in this mode for implementation.

As shown in FIG. 7(a), in the conventional case, there are involved parts where magnetic resonance signals from fat on the body surface are not restrained (arrowed parts) at the ends where the magnetostatic field is not uniform, resulting in the occurrence of artifacts. Unlike that, in this mode for implementation, magnetic resonance signals from fat on the body surface are restrained (solid arrowed parts) at the ends where the magnetostatic field is not uniform as shown in FIG. 7(b), and fat signals in bones are also restrained (broken arrowed parts), resulting in the prevention of artifact occurrence.

Further in this mode for implementation, as stated above, after the execution of the preparation pulse sequence PS, the magnetization moments take on similar values in both cases including the ideal state in which the magnetostatic field is uniform and the unideal state in which the magnetostatic field is not uniform. As a result, by calculating and setting the flip angles of the first chemical saturation pulse CS1 and the second chemical saturation pulse CS2 and the length of preparation time until the imaging pulse sequence IS is executed after the execution of the preparation pulse sequence PS with the assumption that the magnetostatic field is in the ideal state, magnetic resonance signals from fat can be effectively restrained without having to exactly adjusting the flip angles and the length of preparation time. In other words, fat signals can be restrained without relying on the magnitude of the longitudinal magnetization of before the application of the series of RF pulses. Especially where the abdomen is to be imaged with fat signals restrained by an SSFP method using the T2 preparation pulse PR, this feature is useful for image diagnosis because fat signals can be effectively restrained.

Therefore in this mode for implementation, since it is hardly affected by the non-uniformity of the magnetostatic field, fat signals can be effectively restrained and the occurrence of artifacts can be suppressed. For this reason, the efficiency of diagnosis can be enhanced and the quality of images can be improved.

To add, the magnetic resonance imaging apparatus 1 in the mode for implementation described above corresponds to the magnetic resonance imaging apparatus according to the invention. The scanning unit 2 in the above-described mode for implementation corresponds to the scanning unit according to the invention. The image reconstruction unit 31 in the above-described mode for implementation corresponds to the image reconstruction unit according to the invention. Further, the display unit 33 corresponds to the display unit according to the invention.

Implementation of the invention is not limited to the above-described mode for implementation, but various modifications can be adopted.

For instance, when an RF pulse is to be transmitted as the preparation pulse, the flip angle is not limited to any of the aforementioned values. More specifically, as the T2 preparation pulses PR, the 90° RF pulse PR11, the first 180° RF pulse PR21, the second 180° RF pulse PR22, the first −180° RF pulse PR31, the second −180° RF pulse PR32 and the −90° RF pulse PR41 are successively transmitted, but the choice is not limited to these.

Further, though the foregoing description referred to a case of transmitting a rectangular pulse which is effective against the non-uniformity of magnetostatic fields, in transmitting the T2 preparation pulse PR in the mode for implementation described above, the possibility is not limited to this.

Also, the time integral, phase and transmission timing of each pulse can be set as desired. For instance, though the spin echo and the stimulated echo can be prevented from occurring unexpectedly by so accomplishing transmission as to differentiate the time integral of transmitting each of the first killer gradient pulse Gk1, the second killer gradient pulse Gk2 and the third killer gradient pulse Gk3 in this mode for implementation, the way of prevention is not limited to this. For instance, in order to achieve the same effect as the above-stated, the first killer gradient pulse Gk1, the second killer gradient pulse Gk2 and the third killer gradient pulse Gk3 may as well be transmitted on mutually different mutually different axes on the x axis, the y axis and the z axis.

Further for instance, the imaging sequence may be accomplished in any of various other techniques than the SSFP method including FSE (Fast Spin Echo), SE (Spin Echo), GRE (Gradient Recalled Echo) and SPGR (Spoiled GRASS).

Many widely different embodiments of the invention may be configured without departing from the spirit and the scope of the present invention. It should he understood that the present invention is not limited to the specific embodiments described in the specification, except as defined in the appended claims.

The invention claimed is:

1. A magnetic resonance imaging apparatus configured to scan a subject in order to collect magnetic resonance signals from the subject in a magnetostatic field space, said magnetic resonance imaging apparatus comprising:
   a scanning unit configured to execute an imaging pulse sequence to collect magnetic resonance signals from the subject after executing a preparation pulse sequence to transmit preparation pulses, wherein:

during the preparation pulse sequence, said scanning unit is configured to:
excite a spin of the subject by successively transmitting a first chemical saturation pulse, a T2 preparation pulse, and a second chemical saturation pulse, which is a reversed pulse;
transmit a first killer gradient pulse after transmitting the first chemical saturation pulse and before transmitting the T2 preparation pulse;
transmit a second killer gradient pulse after transmitting the T2 preparation pulse and before transmitting the second chemical saturation pulse; and
transmit a third killer gradient pulse after transmitting the second chemical saturation pulse and before executing the imaging pulse sequence.

2. The magnetic resonance imaging apparatus according to claim 1, wherein said scanning unit is further configured to:
transmit the first chemical saturation pulse such that an absolute value of a flip angle is 90°; and
transmit the second chemical saturation pulse such that the absolute value of the flip angle is 180°.

3. The magnetic resonance imaging apparatus according to claim 1, wherein:
said scanning unit is further configured to transmit the first killer gradient pulse, the second killer gradient pulse, and the third killer gradient pulse such that the first killer gradient pulse, the second killer gradient pulse, and the third killer gradient pulse differ in magnitude from one another.

4. The magnetic resonance imaging apparatus according to claim 1, wherein:
said scanning unit is further configured to transmit the first killer gradient pulse, the second killer gradient pulse, and the third killer gradient pulse such that the first killer gradient pulse, the second killer gradient pulse, and the third killer gradient pulse differ in axial direction from one another.

5. The magnetic resonance imaging apparatus according to claim 1, wherein:
said scanning unit is further configured to transmit the first chemical saturation pulse and the second chemical saturation pulse such that, in water and fat contained in the subject, the magnetic resonance signals deriving from the fat are more restrained than the magnetic resonance signals deriving from the water.

6. The magnetic resonance imaging apparatus according to claim 1, wherein:
said scanning unit is further configured to successively transmit as the T2 preparation pulses, a 90° RF pulse, a first 180° RF pulse, a second 180° RF pulse, a first −180° RF pulse, a second −180° RF pulse, and a −90° RF pulse.

7. The magnetic resonance imaging apparatus according to claim 6, wherein:
said scanning unit is further configured to transmit the T2 preparation pulses such that a phase of the first 180° RF pulse, a phase of the second 180° RF pulse, a phase of the first −180° RF pulse, and a phase of the second −180° RF pulse orthogonally cross a phase of the 90° RF pulse and a phase of the −90° RF pulse, respectively.

8. The magnetic resonance imaging apparatus according to claim 7, wherein:
said scanning unit is further configured to transmit the T2 preparation pulses such that compared with a first interval of time between a center point of a time period during which the 90° RF pulse is transmitted and a center point of time of the period during which the first 180° RF pulse is transmitted:
a second interval of time between the center point of the time period during which the 90° RF pulse is transmitted and the center point of the time period during which the first 180° RF pulse is transmitted is made twice as long;
a third interval of time between a center point of a time period during which the second 180° RF pulse is transmitted and a center point of a time period during which the first −180° RF pulse is transmitted is made twice as long;
a fourth interval of time between the center point of time of the period during which the first −180° RF pulse is transmitted and the center point of time of the period during which the second −180° RF pulse is transmitted is made twice as long; and
a fifth interval of time between the center point of the time period during which the second −180° RF pulse is transmitted and a center point of a time period during which the −90° RF pulse is transmitted is made equal in length.

9. The magnetic resonance imaging apparatus according to claim 5, wherein:
said scanning unit is further configured to transmit each of the 90° RF pulse, the first 180° RF pulse, the second 180° RF pulse, the first −180° RF pulse, the second −180° RF pulse, and the −90° RF pulse as a rectangular pulse.

10. The magnetic resonance imaging apparatus according to claim 1, wherein:
said scanning unit, as the imaging pulse sequence, is further configured to repeatedly transmit to the subject RF pulses in such a repeat time that a longitudinal magnetization and a transverse magnetization of the spin constitute a steady state in the subject, and to transmit a slice selecting gradient pulse for selecting the slice of the subject excited by the RF pulses, a phase encoding gradient pulse for phase-encoding magnetic resonance signals generated in the slice excited by the RF pulses, and a frequency encoding gradient pulse for frequency-encoding magnetic resonance signals generated in the slice excited by those RF pulses as to make a time integral within the repeat time zero.

11. A magnetic resonance image generating method wherein, on the basis of magnetic resonance signals collected, by a magnetic resonance imaging apparatus, from a subject by scanning performed regarding the subject in a magnetostatic field space, a magnetic resonance image of the subject is generated, said method comprising:
executing an imaging pulse sequence, by a scanning unit within the magnetic resonance imaging apparatus, to collect magnetic resonance signals from the subject after executing a preparation pulse sequence to transmit preparation pulses, wherein the preparation pulse sequence is executed by:
exciting, by the scanning unit, a spin of the subject by successively transmitting a first chemical saturation pulse, a T2 preparation pulse and a second chemical saturation pulse, which is a reversed pulse;
transmitting a first killer gradient pulse, by the scanning unit, after transmitting the first chemical saturation pulse and before transmitting the T2 preparation pulse;
transmitting a second killer gradient pulse, by the scanning unit, after transmitting the T2 preparation pulse and before transmitting the second chemical saturation pulse; and transmitting a third killer gradient pulse, by the scanning unit, after transmitting the second chemical saturation pulse and before executing the imaging pulse sequence.

12. The magnetic resonance image generating method according to claim 11, wherein:
the preparation pulse sequence is executed by transmitting the first chemical saturation pulse such that an absolute value of the flip angle is 90°; and
transmitting the second chemical saturation pulse such that the absolute value of the flip angle is 180°.

13. The magnetic resonance image generating method according to claim 11, wherein:
the preparation pulse sequence is executed by transmitting the first killer gradient pulse, the second killer gradient pulse, and the third killer gradient pulse such that the first killer gradient pulse, the second killer gradient pulse, and the third killer gradient pulse differ in magnitude from one another.

14. The magnetic resonance image generating method according to claim 11, wherein:
the preparation pulse sequence is executed by transmitting the first killer gradient pulse, the second killer gradient pulse, and the third killer gradient pulse such that the first killer gradient pulse, the second killer gradient pulse, and the third killer gradient pulse differ in axial direction from one another.

15. The magnetic resonance image generating method according to claim 11, wherein:
the preparation pulse sequence is executed by transmitting the first chemical saturation pulse and the second chemical saturation pulse such that, in water and fat contained in the subject, the magnetic resonance signals deriving from the fat are more restrained than the magnetic resonance signals deriving from the water.

16. The magnetic resonance image generating method according to claim 11, wherein:
the preparation pulse sequence is executed by successively transmitting as the T2 preparation pulses, a 90° RF pulse, a first 180° RF pulse, a second 180° RF pulse, a first −180° RF pulse, a second −180° RF pulse and a −90° RF pulse.

17. The magnetic resonance image generating method according to claim 16, wherein:
the preparation pulse sequence is executed by transmitting the T2 preparation pulses that a phase of the first 180° RF pulse, a phase of the second 180° RF pulse, a phase of the first −180° RF pulse, and a phase of the second −180° RF pulse orthogonally cross a phase of the 90° RF pulse and a phase of the −90° RF pulse, respectively.

18. The magnetic resonance image generating method according to claim 17, wherein:
the preparation pulse sequence is executed by transmitting the T2 preparation pulses such that compared with a first interval of time between the center point of time of the period during which the 90° RF pulse is transmitted and the center point of time of the period during which the first 180° RF pulse is transmitted:
a second interval of time between the center point of the time period during which the 90° RF pulse is transmitted and the center point of the time period during which the first 180° RF pulse is transmitted is made twice as long;
a third interval of time between a center point of a time period during which the second 180° RF pulse is transmitted and a center point of a time period during which the first −180° RF pulse is transmitted is made twice as long;
a fourth interval of time between the center point of the time period during which the first −180° RF pulse is transmitted and a center point of a time period during which the second −180° RF pulse is transmitted is made twice as long; and
a fifth interval of time between the center point of the time period during which the second −180° RF pulse is transmitted and a center point of a time period during which the −90° RF pulse is transmitted is made equal in length.

19. The magnetic resonance image generating method according to claim 16, wherein:
the preparation pulse sequence is executed by transmitting each of the 90° RF pulse, the first 180° RF pulse, the second 180° RF pulse, the first −180° RF pulse, the second −180° RF pulse, and the −90° RF pulse as a rectangular pulse.

20. The magnetic resonance image generating method according to claim 11, wherein:
the imaging pulse sequence is executed by repeatedly transmitting to the subject RF pulses in such a repeat time that a longitudinal magnetization and a transverse magnetization of the spin constitute a steady state in the subject, and by transmitting a slice selecting gradient pulse for selecting the slice of the subject excited by the RF pulses, a phase encoding gradient pulse for phase-encoding magnetic resonance signals generated in the slice excited by the RF pulses, and a frequency encoding gradient pulse for frequency-encoding magnetic resonance signals generated in the slice excited by those RF pulses as to make a time integral within the repeat time zero.

* * * * *